United States Patent [19]

Burke et al.

[11] 4,012,617
[45] Mar. 15, 1977

[54] POWER CONTROLLER FOR MICROWAVE MAGNETRON

[75] Inventors: Robert Virgil Burke; Thomas Eugene Hester, both of Fort Wayne, Ind.

[73] Assignee: Litton Systems, Inc., Huntington, Ind.

[22] Filed: July 24, 1975

[21] Appl. No.: 598,864

[52] U.S. Cl. .......................... 219/10.55 B; 323/8; 323/24; 331/86
[51] Int. Cl.² .............................................. H05B 9/06
[58] Field of Search ............ 323/8, 24; 331/86, 87, 331/185, 186; 219/10.55 B; 315/105

[56] References Cited

UNITED STATES PATENTS

| | | | |
|---|---|---|---|
| 3,611,017 | 10/1971 | Freeland | 323/24 X |
| 3,729,651 | 4/1973 | Fricker et al. | 323/24 X |
| 3,780,252 | 12/1973 | Crapuchettes | 331/86 X |
| 3,872,277 | 3/1975 | Niu | 219/10.55 B |
| 3,876,956 | 4/1975 | Levinson | 331/86 X |
| 3,890,537 | 6/1975 | Park et al. | 323/4 X |

OTHER PUBLICATIONS

Appliance Feb. 1975; "Designed for Slow Cooking at Microwave Speed," 2 pp.

*Primary Examiner*—Gerald Goldberg
*Attorney, Agent, or Firm*—Ronald M. Goldman

[57] ABSTRACT

A power supply for a microwave magnetron includes a transformer having a secondary winding, a capacitor connected to one end of the winding, a magnetron connected in between the remaining end of the capacitor and the winding so as to form a first unidirectional current conducting path capable of conducting current in one direction and a second circuit connected in shunt of the magnetron having unidirectional current conduction characteristics and being switchable to an On or Off condition, said second circuit being electrically poled opposite to the polarity of the magnetron and means for controlling the switching of the second circuit to its current conducting condition as a function of the magnitude of current through the magnetron.

15 Claims, 3 Drawing Figures

POWER CONTROLLER FOR MICROWAVE MAGNETRON

REFERENCE TO RELATED APPLICATIONS

This application is co-pending with our related application Ser. No. 598,865 filed July 24, 1975.

BACKGROUND OF THE INVENTION

This invention relates to regulated adjustable electrical power supplies and, in a more specific context, to a regulated adjustable power supply for a microwave magnetron of a microwave oven.

The microwave oven is the familiar appliance used to heat or cook foods by exposure of same to microwave energy radiation. For this purpose conventional microwave ovens employ an electonic vacuum tube, known in the art as a magnetron. Simply stated, the magnetron is a device having unidirectional current carrying characteristics which converts DC voltage and current into energy of the microwave frequency range such as the frequency permitted by law, 2,450 megahertz. To provide that DC voltage, various additonal electrical components are included as a power supply to convert normal household line voltage, typically 120 or 240 volts, 50 to 60 hertz, to the high voltages, on the order of 3,000 to 4,000 volts DC, required in the operation of presently available magnetrons. In its essentials, present microwave oven power supply contains a transformer for stepping up the 120 volt AC to the level of 3,000 to 4,000 volts, depending upon the particular voltage requirement of any specific model of microwave magnetron, a rectifying means, or a voltage doubler-rectifier, and the magnetron itself. And a source of low voltage is provided for the heater of the magnetron. Microwave energy generated by the magnetron is taken from the magnetron output and transmitted either directly into the oven chamber or through a waveguide to the oven chamber.

The average power supplied to the magnetron is set within limits by the design of both the power supply and the magnetron and is generally directly related to the microwave output power generated thereby. It is known that the adjustment of the microwave power can be made within limits by adjustment of the DC current level through the magnetron. Present microwave oven power supplies generally employ a high leakage reactance transformer in combination with a modified half-wave voltage doubler, known also as the "Villard" circuit, to rectify and double the voltage output of the high voltage transformer, and apply a high voltage DC to the magnetron. Examples of such circuits appear in the following patents: U.S. Pat. No. 3,396,342 to Feinberg: U.S. Pat. No. 3,651,371 to Tingley; and U.S. Pat. No. 3,684,978 to Otaguro, which have been made known to petitioners. The circuit provides satisfactory operation and uses a minimum number of components. Recent practice is to provide additional elements within the oven power supply which permit the user to adjust the average power of the magnetron. This has been accomplished as either a two-step "high" or "low power" arrangement or as an adjustable level device allowing continuous adjustment. In the first type of device the value of the capacitance was changed in order to vary the current, such as illustrated in U.S. Pat. No. 3,684,978 to Otaguro. Still another is to employ a Triac control in the primary circuit of the transformer in order to regulate the average amount of current into the power supply, such as found in the Litton Microwave Ovens sold under the brand name "Varicook". In the Varicook circuit a separate filament transformer is required because of the interrupted voltage into the primary of the high voltage transformer, and the expedient of having the filament winding combined as a separate winding upon the high voltage transformer cannot be employed. Additonally the use of pulse techniques, inherent in the Varicook method, in the primary winding of the transformer creates additional stresses on the transformer insulation, which are best avoided.

In the case of current control in the secondary winding circuit, the approach set forth in U.S. Pat. No. 3,684,978 patent does not provide sufficient variety of adjustment, and an adjustable resistor approach disclosed in U.S. Pat. No. 3,760,291 made known to us, appears somewhat impractical and wasteful in that a resistor consumes electrical energy and generates heat.

The present invention relates to the control of the average power output level of a magnetron by controlling the voltage in the secondary of the transformer. More particularly, the invention provides for a control which can be used to allow the user to selectively adjust the power level of the magnetron within a certain range, or, in an alternative application, which may be established adjusted to a fixed level at the factory. In so doing, the filament voltage may be supplied by an additional winding on the same high voltage transformer as is used to provide the high voltages to the magnetron. The primary pulse techniques of the Varicook technique is avoided, improving the reliability of the transformer, and any surges caused by the lightning on the input line as might destroy semiconductor type control devices connected in the primary circuit are minimized.

SUMMARY OF THE INVENTION

Briefly, our invention includes in a power supply of the type having a transformer for providing high voltage AC at a secondary winding, a capacitor in series with the secondary winding and one terminal of a unidirectional current conducting load, such as a magnetron, and a diode connected in shunt of the magnetron oppositely electrically poled thereto. Means are included electrically in series with the diode to selectively control the average current through the diode during the half cycle of AC in which the magnetron is not conducting current and thus control the level of charge and voltage on the capacitor. In this way the level of voltage and current applied to the magnetron on alternate half cycles in which the magnetron conducts current may be selectively adjusted in level. Suitably, in accordance with our invention, means are provided to monitor the current through the magnetron or other unidirectional current conducting load and means responsive to the level of current during the one half cycle of AC for controlling the average value of current through the diode during the other AC half cycle. Ideally the load current is held at or near the selected current level. Thus when the current through the magnetron falls below a certain selected level the control means permits the current through the diode to increase so as to permit a greater charge to be stored in the capacitor during one-half cycle to thereby cause greater current to the magnetron on the alternate half-cycles. Conversely, if the level of current through the magnetron is above a selected level the control means reduces the average value of current through the diode on the other AC half cycle to lessen the charge in the capacitor and thus reduce the level of voltage which appears across the magnetron during the next succeeding alternate half cycle to thereby cause a lesser current through the magnetron. Suitably the reference level can be adjusted by the user to any desired level so as to permit the user to control the power supplied to a magnetron. Alternatively the reference level can be adjusted at the factory to one level or for two separate levels to be obtained depending on the alternative positioning of a switch accessible to the user.

In a more specific aspect of the invention, the control means comprises a semiconductor controlled switch, such as a Triac; means for providing a reference signal representative of the desired magnetron current level; means for comparing the magnitude with that set as the reference and providing an output to the gate of the semiconductor controlled switch at a time before or during the next AC half cycle computed to properly charge the series capacitor.

In a still more detailed aspect of the invention, the means for determining the magnetron current level comprises a first resistance means connected in a electrical series circuit with said magnetron. In addition, a series circuit comprising a resistor and a capacitor is connected across said first resistance means to form a conventional "RC" circuit. Preferably the RC circuit has a time constant, T, the product of capacitance (farads) multiplied by resistance (ohms), (seconds which is approximately ½F seconds), where F is the frequency in cycles per second of the AC high voltage appearing across the transformer secondary winding; and a comparator, such as an operational amplifier, including a non-inverting input and an inverting input is included. The reference voltage is applied to the non-inverting input of the comparator and the voltage across the capacitor in the RC network is applied to the inverting input thereof. When the voltage across the timing capacitor exceeds a certain level the output of the comparator switches from low, to high, to shut off the Triac. Thus during the alternate half cycle in which the voltage applied to the diode is correctly poled so as to normally conduct current, current is blocked since the Triac is not gated on. However at some time during such half cycle the voltage across the timing capacitor discharges to level less than the reference level, which in turn causes the comparator to switch to its "on" state and provides a low gate pulse to the Triac. Once the Triac conducts current, current flows through the capacitor and diode through the remainder of that AC half cycle to thus charge the capacitor. It is noted that on the next succeeding AC half cycle the Triac is essentially shut off, no current flows through the diode, and the magnetron is properly poled with respect to the applied voltage and again conducts current. The voltage across the magnetron at that half cycle equals the sum of the voltage across the capacitor and the AC voltage across the winding of the transformer.

The foregoing objects and advantages of the invention as well as the structure characteristic of the invention are better understood by giving consideration to the detailed description of the preferred embodiments of the invention which follows, considered together with the figures of the drawings.

DESCRIPTION OF THE PREFERRED EMBODIMENTS

Figure 1:
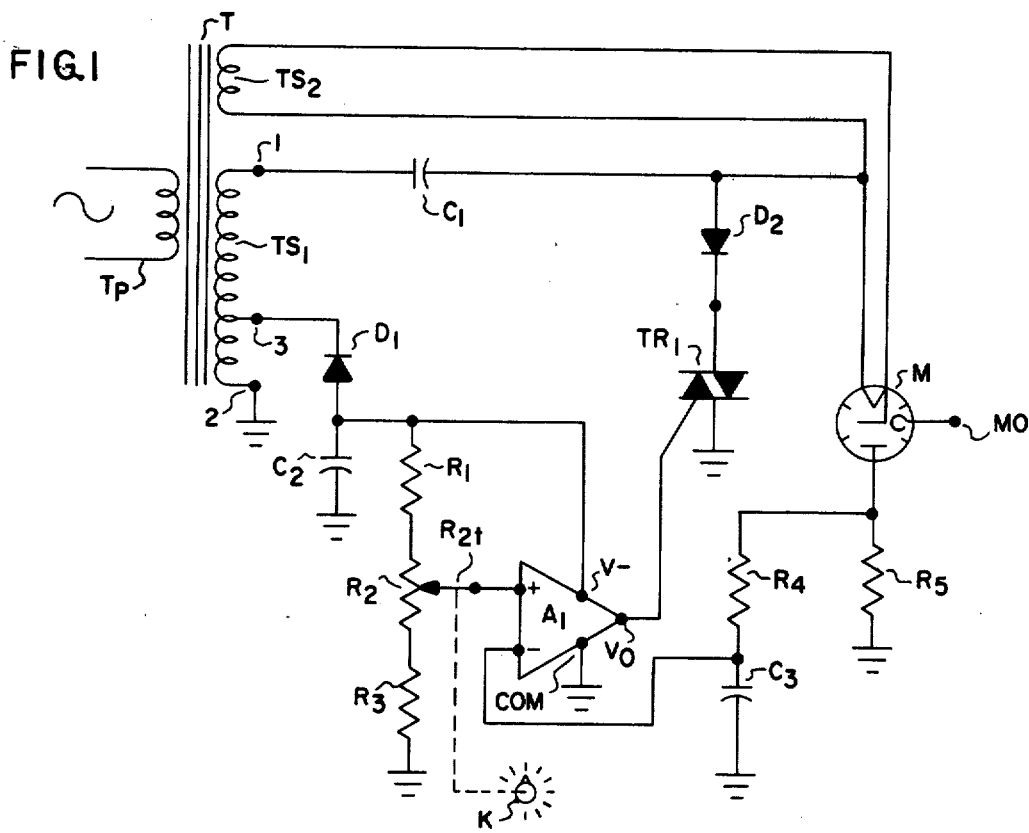
FIG. 1 illustrates a preferred embodiment of the invention.

The preferred embodiment of FIG. 1 includes a transformer T having a primary winding Tp, a high voltage secondary winding Ts1, a low voltage secondary winding Ts2, a capacitor C1, a magnetron M, a rectifier diode D2, a Triac TR1, a comparator A1, a resistor R5, resistor R4, capacitor C3, diode D1, capacitor C2, resistor R1, resistor R3, and potentiometer resistor R2.

Transformer T is of any conventional type, such as has a laminated iron core, with the primary and secondary windings located thereon and with the primary formed from a predetermined number of turns of insulated wire adapted for connection to a source of current, suitable 120-volt 60-hertz, and a high voltage secondary winding Ts1 formed of a large number of turns of relatively fine insulated wire so as to define a large turns ratio between the secondary Ts1 and primary Tp and place the secondary in a step-up voltage relationship with the primary, and secondary winding Ts2 is of a relatively few number of turns of insulated wire, defining a turns ratio with the primary less than one to place the secondary in a voltage step-down relationship with the primary, to provide the low voltage suitable for application to a magnetron heater. A tap is selectively located in secondary winding Ts1 to provide a low voltage relative to the reference point to be obtained. The transformer may be one in which the primary winding is "loosely" coupled to the high voltage secondary, known as a high leakage reactance type transformer found in existing commercial ovens. It is noted however that the transformer may be a ferrite core transformer used in electrical inverter type power supplies providing high-voltage high-frequency on the order of 20 kilohertz or above.

Secondary Ts2 is connected across the two heater cathode terminals of the magnetron. One end 1 of secondary winding Ts1 is connected electrically in series to one end of capacitor C1 ad the other end of the capacitor is connected in circuit to one of the heater cathode terminals of magnetron M. The magnetron anode is connected to one end of resistor R5. The other end of resistor R5 is connected to reference or ground potential as indicated by the ground symbol. The other end 2 of secondary Ts1 is connected to ground. Tap 3 is located at winding Ts1 near the end 2 so as to be at a low voltage point relative to ground. Tap 3 is connected to the cathode terminal of rectifier diode D1. The anode terminal of rectifier diode D1 is connected to one end of capacitor C2 and in turn the remaining end of capacitor C2 is connected to electrical ground potential to form a rectifier-filter circuit. Resistors R1, R2 and R3 are connected in electrical series circuit between the ungrounded end of capacitor C2 and ground potential to form a resistive voltage divider network. Potentiometer resistor R2 contains a conventional movable tap, designated R2t, by means of which the resistance level between an end terminal and the tap may be selectively adjusted in value. This tap is connected electrically to the non-inverting input of comparator A1 as indicated by the plus + sign. The V− power input terminal of comparator A1 is connected in circuit with the ungrounded capacitor C2 and the other power terminal of comparator A1 connected to ground. The output of comparator A1 is connected to the gate of Triac TR1 and the inverting input of comparator A1, as represented by the "−" symbol, is connected in circuit between resistor R4 and capacitor C3. Resistor R4 and capacitor C3 are connected in electrical series circuit and that series circuit is connected in circuit across resistor R5. The anode end of rectifier diode D2 is connected in circuit with the heater cathode terminals of the magnetron and the cathode end of diode D2 is connected to one anode terminal of Triac TR1. The remaining Triac anode terminal is connected to ground potential. The magnetron is situated in one circuit between capacitor C1 and ground and because the magnetron has self-rectifying properties, passing DC current in a direction from its anode to its cathode-heater, the circuit has unidirectional current conducting properties. The diode D2 similarly can pass current only in a direction from its anode to cathode. Since the diode is connected in a second electrical circuit that shunts the first circuit this second circuit has unidirectional current conducting characteristics also, but inasmuch as the diode anode is connected to capacitor C1 this second circuit conducts current only in a direction opposite to the current in the first circuit and is in essence "oppositely electrically poled". It is believed that the description which follows provides sufficient framework in which those skilled in the art may fully understand the function, mode of operation, and relationship of the elements to one another. Those skilled in the art may make use of modern measuring instruments, such as the oscilloscope, to allow observation of the voltages and currents under actual operating conditions of a practical embodiment to acquire a greater understanding of operation.

With a source of AC voltage, such as 120-volts 60-cycle AC, applied to primary Tp of the transformer, by transformer action the primary voltage is stepped up and appears across secondary Ts1 as a high voltage AC. By design this AC voltage is less than that specified for operation of the magnetron. Additionally by transformer action the primary voltage is stepped down and appears across secondary Ts2 as a low AC voltage which by design is that specified by winding Ts2 passes through the magnetron heater which heats the magnetron cathode to make it more electron emmissive, as is known to those skilled in the art. A low voltage AC voltage is produced at tap 3 of the high voltage secondary Ts1. This voltage is rectified by rectifier D1 and the resultant DC current charges capacitor C2 to the predetermined low voltage level to form a low voltage DC power supply for the control circuits. This DC voltage is applied from the ungrounded side of capacitor C2 to the V− input of comparator A2. By selection of the tap location on the transformer secondary the DC voltage established is of the proper level to provide DC power for the comparator A1. In addition, the DC is applied across resistors R1, R2 and R3. The DC current through the resistors produces a voltage or IR drop thereacross and a portion of the voltage drop appears between tap R2t and ground. Adjustable potentiometer tap R2T is movable to various locations on the resistor and hence allows selection of different levels of reference voltage. The tap loction may be connected by means of a shaft indicated by the dash line to a rotatable knob that may be located on the control panel of the microwave oven. A calibration legend to inform the operator of the various power levels may be attained in the oven through rotation of the knob to one position or any other position may be conveniently provided. On the other hand, the tap may be adjusted to a selected position at the factory for a predetermined power level and fixed. It is noted that a push button selected resistor network or equivalent may be substituted for the potentiometer arrangement in accordance with the invention. Magnetron M conducts electrical current only when the voltage at its heater cathode is negative with respect to the magnetron anode and then only when the magnitude of that voltage reaches a predetermined triggering level, such as 3,500 volts by way of example, in the case of a specific model magentron that has a normal operating voltage of about 4,000 volts. Thus the circuit including magnetron M has unidirectional current carrying characteristics. Diode D2 is poled to conduct current in a direction from its anode to its cathode and blocks current from passing in the opposite direction. However since diode D2 is in series with the Triac, current flows only when the Triac is switched into its current conducting condition. The Triac is a well known semiconductor switch device having two current carrying anode terminals and a gate terminal. Functionally the Triac conducts only after a high positive or negative voltage relative to the grounded anode is applied to its gate electrode and thereafter continues to conduct current even after removal of the potential from the Triac gate electrode as long as the current through the anodes does not reduce to zero.

Figure 2A:
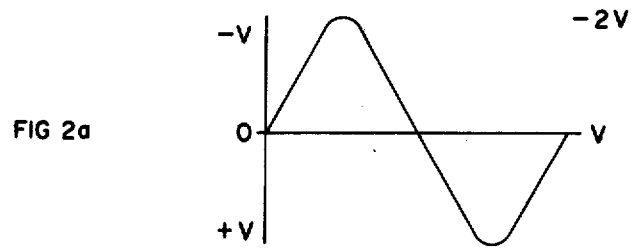
FIG. 2 illustrates characteristic ideal waveshapes of voltages or currents inherent in the operation of the invention.

When the current does so reduce to zero the Triac reverts or switches to its noncurrent conducting condition and can return to its current conducting condition only in response to another initiating voltage applied to its gate electrode. Thus the series circuit of diode D2 and Triac TR1 is switchable and has unidirectional current conducting characteristics. When the AC voltage at winding end 1 is in the negative AC half cycle as is shown theoretically graphically in FIG. 2a relative to the other winding end considered as the voltage reference, the AC voltage at the end of capacitor C1 connected in common to diode D2 and the magnetron is negative.

Assuming for the moment the output of operational amplifier A1 applied to the gate of TR 1 is voltage low, AC voltage at winding end 1 is positive, TR1 is in its "on" or current conducting condition, then current flows from the secondary winding through capacitor C1, through diode D2, through the Triac to ground and thereby the the other end of the transformer secondary. This current charges capacitor C1 to +V. With one-half cycle of alternating current the current and voltage reaches a peak and then decreases to zero. At zero current TR1 restores to its "off" or noncurrent conducting condition and remains off during the next half cycle. As is noted, the current through the second circuit has charged capacitor C1 to a positive potential, +V, theoretically, speaking, to the peak level of voltage which appeared across secondary Ts1. On the next or alternate half cycle the AC voltage across winding Ts1 reverses and makes the voltage at winding end 1 negative with respect to grounded end 2. As this occurs, the voltage on the winding is in additive relationship with the voltage on capacitor C1 and, theoretically speaking, assuming no electrical load, the voltage measured between the diode, anode and ground would attain a level of twice the peak voltage across secondary Ts1 or −2V. This is recognized as a voltage multiplication effect. However in reality as the voltage across secondary Ts1 is buildig up in the reverse direction, at some point the voltage level between the capacitor C2 and ground exceeds that required to initiate current conduction in magnetron M. Inasmuch as the voltage across the magnetron is properly poled, i.e. the cathode is negative with respect to the grounded anode, and current flows during this half cycle in a path from winding end 2, ground, resistor R5, the magnetron, capacitor C1, winding end 1, and through winding Ts1 to winding end 2.

The magnetron, as is known, converts the DC energy into high frequency microwave energy which is taken from output $m_o$ and conventionally routed to the cooking chamber of a microwave oven, not illustrated, the details of which are not necessary to the understanding of the present invention.

Consider now the operation of the control circuits and the selective switching of Triac TR1. The DC current flowing through the magnetron on one-half cycle AC also passes through resistor R5 producing a voltage drop across resistor R5, such as might be represented by any of curves A, B or C of FIG. 2b. This voltage is of a pulsating nature having a peak value equal to that representative of the peak current through the magnetron.

This voltage is applied through resistor R4 to charge capacitor C3 up to essentially peak voltage. Resistor R4 and capacitor C3 are seen to form a familiar RC circuit. For example, during the half cycle when magnetron M is conducting current the voltage across resistor R5 creates a charging current through resistor R4. During the alternate half cycle in which the magnetron is not conducting current the charge on capacitor C3 discharges through resistor R4 and resistor R5 in series.

The time constant of the circuit R4, R5 and C3 is preferably about the same duration as one AC half cycle so that the charge on a capacitor C3 is partially discharged during the alternate half cycles in which magnetron M is not conducting current. For example, the AC half cycle is 8.3 milliseconds and the time constant is 8 milliseconds. Thus during the alternate half cycle the level of voltage on capacitor C3 is representative of the current level through magnetron M during the preceding half cycle. This voltage is ideally illustrated in FIG. 2C. Obviously the greater the voltage of drop across resistor R5 during the half cycle in which the magnetron is conducting current, the greater the level of charge on capacitor C3 as is evident by comparing curves A, B and C in FIG. 2c. In effect, the RC circuit stores the information on the current level through the magnetron in the preceding half cycle for use during the subsequent half cycle. The voltage from capacitor C3 is coupled to the inverting input "−" of operational amplifier A1. It is noted that this time constant can be made longer or shorter than the described one-half seconds, with concurrent change in value on other circuit components, to obtain similar but less satisfactory results.

Briefly, the operational amplifier is a well-known circuit device and is here used as a comparator by means of which the voltage level representative of current through the magnetron is compared to the predetermined voltage level established at the reference input thereof from the tap of potentionmeter resistor R2. The operational amplifier or comparator, as may be variously termed here, is illustrated by a conventional symbol. However, the circuit in fact is a somewhat complicated component having numerous transistors, diodes, and resistors on a single integrated circuit chip. Such types of devices are available from the semiconductor manufacturers and one type CA 741 or equivalent. Briefly, in operation, the output of the operational amplifier is negative low when the level of voltage at its inverting input is less than the voltage level at its reference input. When the voltage at the inverting input exceeds the voltage level at the reference input, the output is zero. As is shown, the output of the comparator A1 is coupled to the gate electrode of the Triac TR1. The Triac blocks current flow through the path from one side of capacitor C1, diode D2, Triac to ground and thence to the other side of the secondary Ts1 until the voltage at the inverting input of comparator A1 falls below the reference level.

Returning now to the state of charge on capacitor C3, it is apparent that capacitor C3 was charged during the preceding AC half cycle to a certain voltage which is representative of the current through the magnetron. This voltage is greater than the reference voltage applied to the reference input of the comparator. However, during the half cycle the voltage on capacitor C3 reduces to below this reference level and the output of comparator A1 turns negative and turns on the Triac. This occurs during the next AC half cycle when magnetron M is not conducting current and when voltage applied to the anode of diode D2 is proper for conduction. Considering curve a' of FIG. 2c as representative of the voltage on capacitor C3 at this time, Triac switching occurs when curve A' and the dash line Vref intersect. With Triac TR1 in the On condition and diode D2 properly poled, current commences to flow through that circuit to charge the capacitor C1 to the level of voltage of AC at the time the circuit conducts current.

Consider next the case where the current through the magnetron is excessive. In that event capacitor C3 is charged to a higher voltage than in the preceding case as represented in curve C of FIG. 2c. Accordingly, during the alternate half cycle the degree of discharge of this capacitor takes a longer period of time and does not fall to the reference level, $V_{REF}$, until a later time within the next alternate half cycle, in comparison to the preceding case, as may be represented by curve C of FIG. 2c. Thus amplifier A1 switches on at a later time and allows Triac TR1 to switch on at a later time to initiate current through the path including diode D2 and Triac TR1 to charge capacitor C1 to a lower voltage level.

Figure 2B:
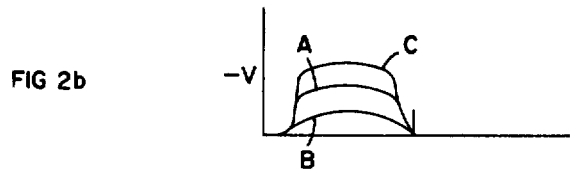
Figure 2C:
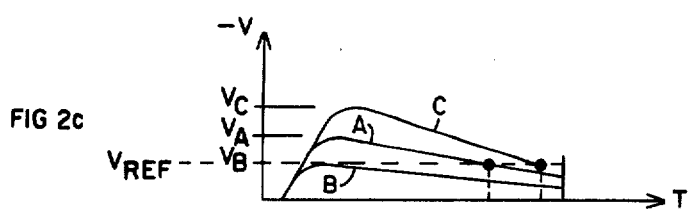

Similarly where the magentron conducts less than the desired current in one AC half cycle, the voltage across R5, represented ideally by curve B of FIG. 2b, is lower, capacitor C3 is charged to a lower value, the voltage on capacitor C3 in the next succeeding half cycle will drop more rapidly in time to the reference voltage level during the next half cycle of AC, as ideally represented by curve B' of FIG. 2c, and the operational amplifier A1 switches on Triac TR1 at an earlier time within the next succeeding half cycle, so that capacitor C1 is charged to a greater voltage. It is of course understood that a greater current will flow through the magnetron during the next succeeding AC half cycle since the voltage on the capacitor will be additive with the voltage of winding Ts1.

By a judicious choice of voltage levels and circuit time constants, the current level of the magnetrons is monitored or sampled during each half cycle in which it conducts. This information is used thereafter in the next AC half cycle to gate or ungate the shunt current path across the magnetron in order to regulate the level of charge on the series capacitor C1, which in turn affects the current level of the magnetron in the next succeeding half cycle in which the magnetron again conducts current.

In essence there is a high voltage secondary winding, a series capacitor and a magnetron which is a unidirectional current conducting device connected in a series circuit. There is an additional circuit for conducting current in shunt of the magnetron during the half cycles in which the magnetron is not properly poled for conducting current so as to provide a voltage doubling effect by charging up the capacitor during those alternate half cycles. Shunt current path is effectively blocked during the half cycles in which the magnetron is conducting and remains blocked until the beginning of or at some point of time within the next half cycle of AC when the control means again unblocks the shunt current path to allow the capacitor to receive some electrical charge and the control means is responsive to the level of current through the magnetron in the preceding half cycle as the determinant of the time at or within the next succeeding half cycle in which the control means unblocks the current.

If the average current to the magnetron is increased, the average power is increased. By adjusting the reference voltage at the reference of the comparator A1, higher or lower, the magnetron power level may be easily adjusted.

Within the spirit of the invention, and viewed in a broader context, it is apparent that other electrical loads having a unidirectional current conducting characteristic can be utilized or substituted for the magnetron to achieve the same effect and advantage.

Moreover, other obvious variations are apparent simply from FIG. 1. As was earlier indicated, the magnetron includes a heater and a low voltage secondary winding Ts2 is provided on the transformer T to supply heater current. As is well known however, a second transformer or other means can be used for this purpose even though such are more expensive alternatives. Viewed specifically, the novel arrangement as applied in combination with a magnetron permits the heater winding to be employed on the same transformer core as the high voltage secondary. Similarly, while I employ a DC source to supply the reference and power supply voltages for operational A1 as a rectifier filter combination consisting of diodes D1 and C2 coupled to a low voltage tap on secondary Ts1, it is equally possible to accomplish this function either by substituting for that a separate DC source or, alternatively, providing a low voltage AC winding separate from the secondary Ts1, such as is the case with the heater winding, or providing a separate transformer entirely to provide to the low voltage AC into the rectifier D1. These are obviously more expensive alternatives. While the Triac is used in the mode where it initially blocks current it is equally possible for a device to be used in accordance with the teachings of our invention to normally allow current to flow initially and then to block the current. In effect, a reversal of parts from that illustrated but for the same purpose of regulating the degree of charge and the voltage to which the capacitor C1 is charged during alternate half cycles when the magnetron is not poled for conducting current.

Ideally, a single silicon controlled rectifier can be substituted for the diode and Triac in FIG. 1 to perform the same functions. With a regular SCR voltage if available for operation with a negative gating or by incorporating an inverter in the circuit to invert the amplifier output to a positive voltage. However this substitution is presently permissible only in a low voltage power supply in which some other electrical load other than the magnetron is driven. The magnetron operating in the voltage range of 3,000 to 4,000 volts or more, current semiconductor control devices are not capable of withstanding back voltages at that level, although diodes such as diode D2 are available which can withstand such high voltages. Moreover the Triac is somewhat self-protecting against reverse voltage transients and is thus preferred in comparison to presently available silicon controlled rectifiers.

The serious problems connected with the operation of magnetrons is that of moding or mismoding. That is under certain circumstances, when power supply voltage is applied to the magnetron, the magnetron may go into oscillation at a frequency at which the magnetron was not designed to operate instead of the correct frequency. This phenomenon is an inherent difficulty in using magnetrons and occurs chiefly in operation of magnetrons in the pulse mode, typically in radar systems where the full voltage is applied almost instantaneously, such as like a step function. If however the anode voltage is applied gradually to the desired level, such as at audio frequencies or below, the phenomenon of moding does not usually occur. However, were the magnetron circuit to be gated on and off directly, as by a device such as a silicon controlled rectifier or Triac, which have very fast operate times on the order of nanoseconds, a mismoding problem could arise. However, as is seen in the circuit, the rapid turn on of the Triac or semiconductor control rectifier occurs during the charging of the capacitor and does not directly gate on or off the magnetron. In its specific context the invention provides a unique feedback control circuit for regulating the current level of a magnetron in which the rapid switching of current occurs during the alternate half cycles in which the magnetron is not operating. It is anticipated that any voltage transients that may arise and appear to cause difficulties can be cured by judicious insertion of suitable protective devices, such as Zener diodes.

It is noted that with present magnetrons it is not necessary to adjust the voltage applid to the magnetron over a full range from zero volts to maximum operating voltage, but that only a limited range of voltage variation is satisfactory. By way of example a model 2M53 magnetron may provide an output of 600 watts with an applied voltage of 4000 volts and may provide but 100 watts output with an applied voltage of 3500 volts; only 500 volts less to obtain a six fold reduction in power output.

Therefore it is only necessary to reduce the charge or voltage on the main capacitor by a small percentage to obtain a large percentage reduction in power output and vice-versa.

The reader may make reference to chapter 5 Clamper Circuits pp65–71 of the book "Semi Conductor Pulse Circuits", Mitchell Holt, Rinehart, & Winston, 1970 for relevent background principle to the clamping of voltages to different levels and which formed part of the helpful knowledge from which the present invention evolves.

Figure 3:
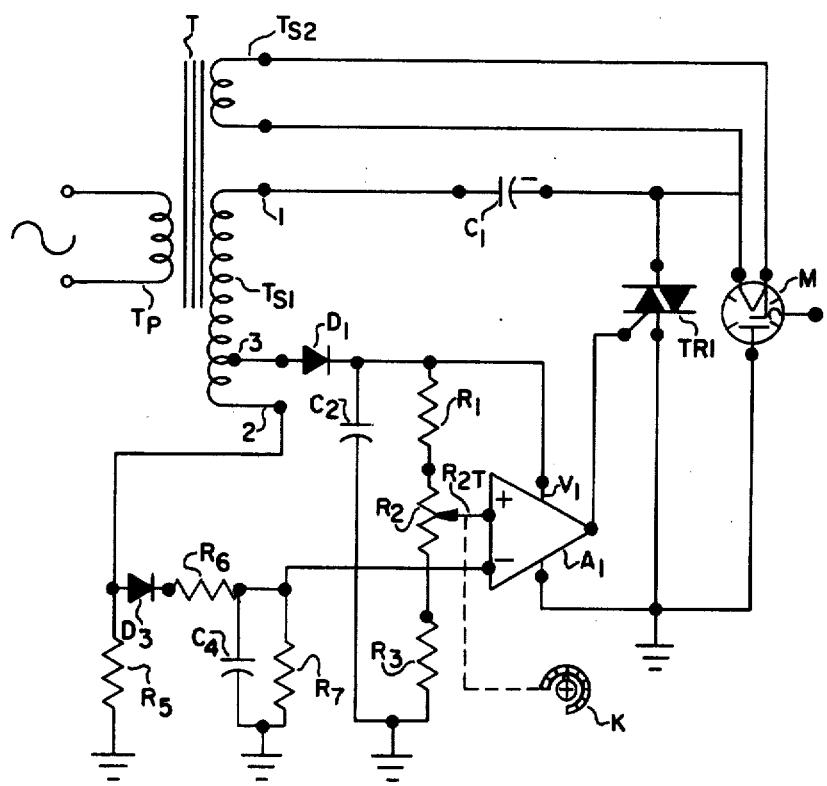
FIG. 3 represents another embodiment of the invention.

Reference is made to a second embodiment of the invention presented in FIG. 3. For clarity those elements in this embodiment which are the same, essentially, as those described in connection with FIG. 1 are identified by the same reference character used in FIG. 1 to identify the element. Moreover in as much as most of the elements in FIG. 3 are connected in the same manner and have the same function as in the preceeding embodiment, they will not be redescribed in the interests of clarity and conciseness and the following description of structure may be confined to those changes or modifications in the circuit.

Thus, the anode of magnetron M is connected electrically to ground. The end 2 of secondary winding TS1 is connected in series with resistor R5 to ground. High voltage diode D2, used in FIG. 1, is not used in this figure. Diode D1 is connected in circuit with the diode anode end connected to secondary tap 3 and the diode cathode end to the circuit junction of capacitor C2 and resistor R1, and is thus reversed in polarity from the diode circuit orientation in the embodiment of FIG. 1, to rectify and produce a positive polarity voltage at the circuit juncture of the capacitor C2 and resistor R1 and hence at the non-inverting input of operational amplifier A1.

The anode of a rectifier diode D3 is connected in circuit with secondary winding end 2 and one end of resistor R5.

Resistor R6 and capacitor C4 are connected electrically in series circuit between the anode of diode D3 and ground. A bleeder resistor R7 is connected electrically in shunt of capacitor C4. The circuit juncture of resistor R6 and capacitor C4 is connected to the inverting input of amplifier A1 to apply any voltage on capacitor C4 to the amplifier inverting "−" input.

Resistor R7 and capacitor C4 essentially perform the same function as an R-C circuit performed by resistor R4 and capacitor C3 in the embodiment of FIG. 1. However, because rectifier diode D3 is included in this circuit and blocks current flow in one direction, a resistor R7 is provided to provide a path for current out of the capacitor so that capacitor C4 may be electrically discharged.

The mode of operation of the circuit is the same as that of the embodiment of FIG. 1 in most part and the reader may make reference to that preceeding description.

Diode D, rectifies the low voltage a c that appears at low voltage tap 3 of secondary TS1 and provides a positive polarity voltage to charge up capacitor C2 and the rectifier and capacitor function as a positive d c voltage source. This voltage is applied to the V, input of A, to provide power to the amplifier and to the resistive voltage divide network R1, R2 and R3 so that a positive polarity voltage is applied via potentiometer tap R2t to the non-inverting input + of A1.

The magnetron current flows in a series circuit including capacitor C1, secondary winding TS1, resistor R5, and ground. Hence the voltage drop across R5 during the a c half cycle in which the magnetron conducts current is proportioned to the magnetron current as in the preceeding embodiment. The polarity of the voltage drop is positive with respect to ground and this is then applied through resistor R6 to charge up capacitor C4.

During the alternate half cycles in which magnetron M is not conducting current, the voltage drop across R5 is representative essentially of current to charge capacitor C1. Since the latter current is opposite in direction to the preceeding current through the magnetron, the voltage at resistor R5 is negative in polarity. Diode D3 acts to block that negative voltage from being applied to capacitor C4.

Thus capacitor C4 is charged to a voltage of positive polarity during one half cycle and that voltage level is representative of the d.c. current through magnetron M. During the next half cycle of a.c. during which the power circuit capacitor C1 is to be charged, capacitor C4 commences to discharge through resistor R7. At any given period of time during this half cycle, the voltage on C4 is a function of the time cnstant, RC, of the circuit R7 and C4 and the voltage level to which capacitor C4 was initially charged. As in the embodiment of FIG. 1 this time constant is preferably equal to ½f, where f is the line voltage frequency, such as 8 milliseconds.

As in the preceeding embodiment, the voltage at the inverting input of A, decreases to a level equal to that reference voltage applied via tap R2t to the inverting input. At that time differential amplifier A1 switches its output from zero to a high positive voltage to apply an enabling input to the gate of triac TR1 and the triac switches into its current conducting condition.

As in the embodiment of FIG. 1, the point in time during a half cycle of a c at which the amplifier A1 switches, shifts about, depending on the magnetron current level during the preceeding half cycle to automatically ideally, via this feedback mechanism, the voltage to which capacitor C1 charges.

Setting of tap R2t via knob K allows the same adjustment as in the preceeding embodiment of FIG. 1.

It is noted that since the embodiment of FIG. 3 employs a positive output voltage to trigger triac TR1 to its "on" condition, as contrasted with a negative trigger voltage in the embodiment of FIG. 1, those electronic semiconductor switching devices which require a positive trigger voltage, such as a silicon controlled rectifier, or a series circuit of a rectifier diode and silicon controlled rectifier, both electrically poled in the same direction, may be directly substituted for triac TR1.

By omitting the diode D2 in the embodiment of FIG. 1 and as a result of the absence of a diode in series with the triac in the embodiment of FIG. 2 certain high voltage transients are eliminated. Thus the triac is selected to have a voltage breakdown characteristic of between 1.1 to 2 times the magnitude of the normal operating voltage of the magnetron as specified by the magnetron manufacturer. This is the characteristic in which the semiconductor switch goes into its conducting state, irrespective of any gating voltage. By way of example we select a triac having a breakdown voltage of 4,500 volts for a magnetron having a normal operating voltage of 4,000 volts.

In the event that a high transient voltage commences to develop and reaches 4,500 volts the triac in FIG. 2 will break down and conduct the current, shunting the current from the magnetron and the triac continues to conduct the current until the current there through falls to zero. The triac then restores to its "off" or non-current conducting state.

Thus although in normal operation of the circuit the triac conducts current in only one direction to charge the main series capacitor, in the abnormal or voltage transient suppressing mode, the triac also conducts current in the opposite direction to discharge the main capacitor and protect the circuit against high voltage transients.

It is believed that the foregoing description of the embodiments of our invention is sufficient in detail to enable one skilled in the art to make and use the invention. However it is expressly understood that the specific details presented for that purpose are not intended in any way to limit the invention inasmuch as numerous modifications, alterations or substitutions of equivalents, such as those in part described in the preceding specification, may be made by those skilled in the art upon reading this specification in accordance with the teachings herein contained. It is requested that our invention be broadly construed within the full spirit and scope of the appended claims.

What is claimed is:

1. The combination in a microwave oven power supply comprising:

transformer means, said transformer means having a primary winding for connection to a source of AC and a secondary winding for providing a high voltage AC transformed from said primary across the secondary winding ends, said AC voltage having a generally cyclically varying sinusoidal waveform including a first one-half cycle in which the voltage level over a period of time, T, rises from zero to a maximum in one polarity direction and then reduces to zero followed by an alternate half cycle in which the voltage level over a time, T, rises from zero to a maximum in an opposite polarity direction and then reduces to zero;

capacitor means;

a magnetron, said magnetron having uni-directional current-carrying characteristics so as to conduct current only on one-half cycle of AC;

means connecting said secondary winding, said capacitor means and said magnetron in an electrical series circuit;

semiconductor controlled switch means of the type having a gate input and a pair of current-conducting main terminals, said switch means further being of the type having an electrically nonconductive state and responsive to application of a control voltage to its said gate input for substantially instantaneously, in a time substantially less than T, switching into a current-conducting condition to pass current between said main terminals and responsive to the current between said main terminals reducing effectively to a level of zero and absent a control voltage at said gate input for substantially instantaneously, in a time substantially less than T, restoring to the electrically nonconductive state;

said semiconductor controlled switch means being connected in circuit essentially in series with said capacitor means and said secondary winding and essentially in shunt of said magnetron for conducting current in shunt of said magnetron responsive to the application of a control voltage to the gate input thereof;

current monitoring means, comprising resistor means connected in electrical series circuit with said magnetron, for providing an output signal representative of the magnetron current during said one-half cycle;

timing means coupled to said current monitoring means for providing a time varying signal that changes in level with lapse of time during the alternate half-cycle of AC and has an initial level representative of the current level in said magnetron during the preceding one-half cycle, whereby said time varying signal attains a predetermined level as a function of both the magnetron current level and lapse of time, said timing means comprising: a resistor and a capacitor electrically connected in series circuit across said resistor of said current monitoring means, said circuit having a time constant, $T_c$, where $T_c$ equals the product of the capacitance measured in farads and R is the value of resistance measured in ohms, with said $T_c$ being less than ½ F, where F is the frequency of the AC supplied by said transformer;

control means coupled to said timing means responsive to the level of said time varying signal attaining a predetermined value during said alternate half cycle for thereupon providing a control voltage pulse to said gate input of said semiconductor controlled switch means, said control means comprising: comparator means, said comparator means having a reference input, an inverting input and an output; reference voltage source means; means connecting said reference voltage source means to said reference input of said comparator means; means connecting the output of said comparator means to the gate electrode of said semiconductor controlled switch means; and means coupling the voltage from said capacitor of said timing means to the inverting input of said comparator means.

2. The invention as defined in claim 1 wherein said control means includes:

comparator means, said comparator means having a reference input and an inverting input and an output;

a source of reference voltage coupled to said reference input, said source being adjustable in level; and means coupling said time varying signal to said inverting input.

3. The invention as defined in claim 1 wherein said reference voltage source means includes means for adjusting the reference voltage output thereof.

4. The invention as defined in claim 1 wherein said reference voltage source means comprises:

a source of DC voltage;

resistor means connected across said source of voltage, said resistor means including a tap, whereby a reference voltage is produced at said tap.

5. The invention as defined in claim 4 wherein said tap is selectively positionable so as to permit adjustment of said reference potential.

6. The invention as defined in claim 5 wherein said DC voltage source comprises:

tap means on said secondary of said transformer;

rectifier and filter means connected in circuit therewith to provide a DC voltage at said capacitor.

7. The invention as defined in claim 1 wherein semiconductor controlled switch comprises a Triac.

8. A regulated power supply for an electrical load of the type having uni-directional current-conducting characteristics comprising:

transformer means for producing an AC voltage across a secondary winding;

capacitor means, one end of said capacitor means being connected with one end of said secondary winding;

means for connecting said uni-directional current-conditioning load in series circuit between the remaining end of said capacitor means and the remaining end of said secondary winding:

a second electrical circuit connected between said remaining end of said capacitor and said remaining end of said secondary winding in parallel of said first circuit, said second electrical circuit having uni-directional current-carrying characteristics and oppositely poled with respect to said first circuit for conducting current only during alternate half cycles, said second electrical circuit being switchable between a current-conducting condition and a non-current-conducting condition for regulating the average value of current therethrough and thereby the charge on said capacitor during the half cycle in which said first circuit is in the noncurrent-conducting condition:

a resistor connected in circuit with said first circuit so as to produce a voltage thereacross representative of current through said first circuit;

timing circuit means comprising resistor means and capacitor means connected in series across said first resistor means, said timing circuit having a product of resistance in ohms × capacitance in microfarads equal to or less than 8.3 milliseconds for charging to the level of voltage across said first resistor means during said first half cycle and slowly discharging during the next half cycle;

comparator means having a reference voltage input and an inverting input and an output;

means for applying a reference voltage to said reference input;

means for applying the voltage across said capacitor in said timing circuit to said inverting input; and means for coupling the output of said comparator to said second circuit for switching said second circuit between the Off and On condition;

whereby during an alternate half cycle the voltage across the capacitor in the timing network drops to the reference voltage level and said comparator provides an output which allows said second circuit to conduct current for the remainder of said alternate half cycle.

9. A power supply for a microwave magnetron comprising:

a transformer having a primary winding for connection to a source of electrical power and a high voltage secondary winding adapted to have an AC voltage of frequency F induced thereacross from said primary;

capacitor means, said capacitor means having one secondary end connected to an end;

diode rectifier means;

Triac means, said Triac means and said diode rectifier means being connected in series circuit between the remaining end of said secondary winding and the remaining end of said capacitor means;

a magnetron;

resistor means;

means for connecting said resistor means and said magnetron in series circuit betwen said remaining end of said secondary winding and said remaining end of said capacitor means;

said magnetron being electrically poled in circuit in opposite electrical polarity relationship to the direction in which said diode is poled so that the circuit containing said magnetron conducts current only in one direction and the circuit containing said diode conducts current only in the reverse direction;

an R-C circuit means connected across said resistor means, said R-C circuit comprising a resistor and capacitor connected in series and having a time constant, T, less than ½F;

comparator means, said comparator means having a reference input, an inverting input and an output;

means for applying enabling voltages to said gate electrode of said Triac under control of said comparator output;

means for applying a reference voltage from a reference voltage source to said reference input of said comparator means, said reference voltage source being selectively adjustable; and means for coupling the output of said R-C circuit to said inverting input of said comparator means;

whereby on one-half cycle of AC across said secondary current will flow through said winding, said series capacitor, said magnetron and said resistor to develop a voltage across said resistor proportional to the current through said magnetron during that half cycle and on the opposite half cycle said magnetron is nonconducting;

whereby said R-C network receives and stores a voltage proportional to the voltage across said first resistor means through to the alternate AC half cycle and wherein said comparison means enables said Triac only at some predetermined time within such alternate half cycle in which said diode is poled to conduct current;

whereby said capacitor will be charged only to a voltage level existing at the time within said alternate half cycle in which said Triac is enabled.

10. The invention as defined in claim 9 wherein said comparator means comprises an operational amplifier.

11. The invention as defined in claim 9 wherein said means for applying enabling voltages to said gate electrode of said Triac under control of said comparator output comprises: electrical conductor means coupled between said comparator output and the gate electrode of said Triac.

12. In a microwave oven power supply the combination comprising:

transformer means, said transformer means having a primary winding for connection to a source of AC and a secondary winding for providing a high voltage AC transformed from said primary across the secondary winding ends, said AC voltage having a generally cyclically varying sinusoidal waveform including a first one-half cycle in which the voltage level over a period of time, T, rises from Zero to a maximum in one polarity direction and then reduces to zero followed by an alternate half cycle in which the voltage level over a time, T, rises from zero to a maximum in an opposite polarity direction and then reduces to zero;

capacitor means;

a magnetron, said magnetron having uni-directional current-carrying characteristics so as to conduct current only on one-half cycle of AC;

means connecting said secondary winding, said capacitor means and said magnetron in an electrical series circuit;

semiconductor controlled switch means of the type having a gate input and a pair of current-conducting main terminals, said switch means further being of the type having an electrically nonconductive state and responsive to application of a control voltage to its said gate input for substantially instantaneously, in a time substantially less than T, switching into a current conducting condition to pass current between said main terminals and responsive to the current between said main terminals reducing effectively to a level of zero in the absence of a control voltage at said gate input for substantially instantaneously, in a time substantially less than T, restoring to the electrically nonconductive state;

said semiconductor controlled switch means being connected in circuit essentially in series with said capacitor means and said secondary winding and essentially in shunt of said magnetron for conducting current in shunt of said magnetron responsive to the application of a control voltage to the gate input thereof;

current monitoring means for providing an output signal representative of the magnetron current during said one-half cycle;

timing means coupled to said current monitoring means for providing a time varying signal that changes in level with lapse of time during the alternative half-cycle of AC and has an initial level representative of the current level in said magnetron during the preceding one-half cycle, whereby said time varying signal attains a predetermined level as a function of both the magnetron current level and lapse of time;

control means coupled to said timing means responsive to the level of said time varying signal attaining a predetermined value during said alternate half cycle for thereupon providing a control voltage pulse to said gate input of said semiconductor controlled switch means;

whereby said switch means conducts current in shunt of said magnetron to said capacitor means for the remaining duration of said alternate half cycle.

13. The invention as defined in claim 12 wherein said timing means comprises a resistor and a capacitor connected electrically in series circuit.

14. In a microwave oven power supply the combination comprising:

transformer means having a primary winding for connection to a source of AC voltage and a high voltage secondary winding for providing a high AC voltage transformed from said primary across the secondary winding ends; said AC voltage having a generally sinusoidal cyclically varying waveform including a first one-half cycle in which the voltage level over a period of time, T, rises from zero to a peak in one polarity direction and then decreases to zero followed by an alternate half cycle in which the current level over a period of time, T, rises from zero to a peak in an opposite direction and then decreases to zero;

capacitor means having first and second ends, said capacitor means having one end connected to an end of said secondary winding;

means for connecting a magnetron in circuit between the remaining end of said capacitor means and the remaining end of said second winding to define an electrical series circuit in which the voltage across said capacitor means is in additive relation with the voltage of said secondary winding during the one-half cycle of AC, said magnetron having uni-directional current-carrying characteristics so as to conduct current only during the one-half cycle of said AC voltage;

current monitoring means for providing an output representative of magnetron current during the one-half cycle; and control circuit means connected in shunt of said magnetron and coupled to said current monitoring means for initiating current flow through said capacitor, by-passing said magnetron, at a first predetermined instant of time within the alternate half cycle responsive to said output of said current monitoring means being at a predetermined level and for initiating current flow through said capacitor and by-passing said magnetron at a second predetermined instant of time within said alternate half-cycle greater or less, respectively, than said first predetermined instant of time responsive to said output of said current monitoring means being above or below, respectively, said predetermined level and for terminating said current at the conclusion of said alternate half-cycle.

15. In a microwave oven power supply the combination comprising:

transformer means, said transformer means having a primary winding for connection to a source of AC voltage and a high voltage secondary winding for providing a high AC voltage transformed from said primary across the secondary winding ends;

said AC voltage having a generally sinusoidal cyclically varying waveform including a first one-half cycle in which the voltage level over a period of time, T, rises from zero to a peak in one polarity direction and then decreases to zero followed by an alternate half cycle in which the current level over a period of time, T, rises from zero to a peak in an opposite direction and then decreases to zero;

capacitor means having first and second ends, said capacitor means having one end connected to an end of second secondary winding;

means for connecting a magnetron in circuit between the remaining end of said capacitor means and the remaining end of said secondary winding to define an electrical series circuit in which the voltage across said capacitor means is in additive relation with the voltage of said secondary winding during the one-half cycle of AC, said magnetron having uni-directional current-carrying characteristics so as to conduct current only during the one-half cycle of said AC voltage;

charge control means responsive to magnetron current during the one-half cycle of AC voltage for permitting electrical charge to be applied to said capacitor means during an alternate half-cycle and controlling such charge to a level dependent upon and automatically determined as a function of said magnetron current level during the immediately preceding one-half cycle whereby a voltage appears across said capacitor;

said charge control means including:

semiconductor controlled switch means, said semiconductor controlled switch means of the type including a gate input and a pair of main terminals, said controlled switch means is normally in an electrically nonconducting state in which no current may pass between said main terminals and, responsive to a control voltage applied to its gate input, for substantially instantaneously, in a time substantially less than said T, switching into a current-conducting state in which current may pass between said two main terminals and, responsive to current through said terminals attaining a level effectively of zero and in the absence of a control voltage at said gate input for automatically substantially instantaneously, in a time substantially less than said T, restoring to its electrically nonconductive state;

said semiconductor switch means being connected in electrical circuit in shunt of said magnetron for conducting current to said capacitor means by-passing said magnetron responsive to the application of a control voltage to said gate input;

current monitoring means responsive to the level of current through said magnetron during the one-half cycle for providing an output signal of a level proportionate to said magnetron current; and control circuit means coupled to said current monitoring means and said semiconductor switch means for equating said level of said output signal of said current monitoring means with a corresponding one of a plurality of elapsed time intervals, each of which time intervals is equal to or less than said time T, and for providing a control voltage pulse to said gate input of said semiconductor controlled switch means at the expiration of a time interval, commencing with the alternate half cycle which follows the said one-half cycle, equal to said corresponding one of said elapsed time intervals;

whereby said semiconductor controlled switch means may conduct current by-passing said magnetron and passing to said capacitor means for the duration of the alternate half cycle.

* * * * *